United States Patent [19]

Dutartre et al.

[11] Patent Number: 5,252,181
[45] Date of Patent: Oct. 12, 1993

[54] METHOD FOR CLEANING THE SURFACE OF A SUBSTRATE WITH PLASMA

[75] Inventors: Didier Dutartre, Meylan; Daniel Bensahel, Grenoble; Jorge L. Regolini, Meylan, all of France

[73] Assignee: Etablissement Autonome de Droit Public: France Telecom, France

[21] Appl. No.: 808,745

[22] Filed: Dec. 17, 1991

[30] Foreign Application Priority Data

Dec. 20, 1990 [FR] France .................. 90 16385

[51] Int. Cl.$^5$ ............................ B44C 1/22
[52] U.S. Cl. ................... 156/651; 437/937; 437/946
[58] Field of Search .......... 148/DIG. 17; 156/625, 156/643, 650, 651; 437/937, 939, 946; 204/192.37

[56] References Cited

U.S. PATENT DOCUMENTS 4,923,828  5/1990  Gluck et al. ............ 148/DIG. 17
5,043,299  8/1991  Chang et al. ............ 156/625

FOREIGN PATENT DOCUMENTS 0370775  5/1990  European Pat. Off. ....... 437/946
2148171A  5/1985  United Kingdom .

OTHER PUBLICATIONS

Journal of Applies Physics, vol. 68, No. 9, Nov. 1, 1990, pp. 4681–4693, NY, NY; T.-R. Yew et al.: "Low-temperature in situ surface cleaning of oxide-patterned wafers by Ar/H$_2$ plasma sputter".
Journal of Applied Physics, vol. 62, No. 10, Nov. 15, 1987, pp. 4255–4268, Woodbury, NY; W. R. Burger et al.: "An optimized in situ argon sputter cleaning process for . . .".

Primary Examiner—Brian E. Hearn
Assistant Examiner—C. Chaudhari
Attorney, Agent, or Firm—Bacon & Thomas

[57] ABSTRACT

Method for cleaning, with plasma, the surface of a substrate before another treatment, consisting:
  in a first cleaning step, in negatively polarizing the substrate and in subjecting it to an argon plasma, and
  in a second cleaning step, in subjecting the pretreated substrate to a hydrogen plasma, in order to ensure an efficient cleaning of the surface of the substrate.
Application to the prior cleaning of a silicon substrate intended to receive an epitaxy.

7 Claims, 1 Drawing Sheet

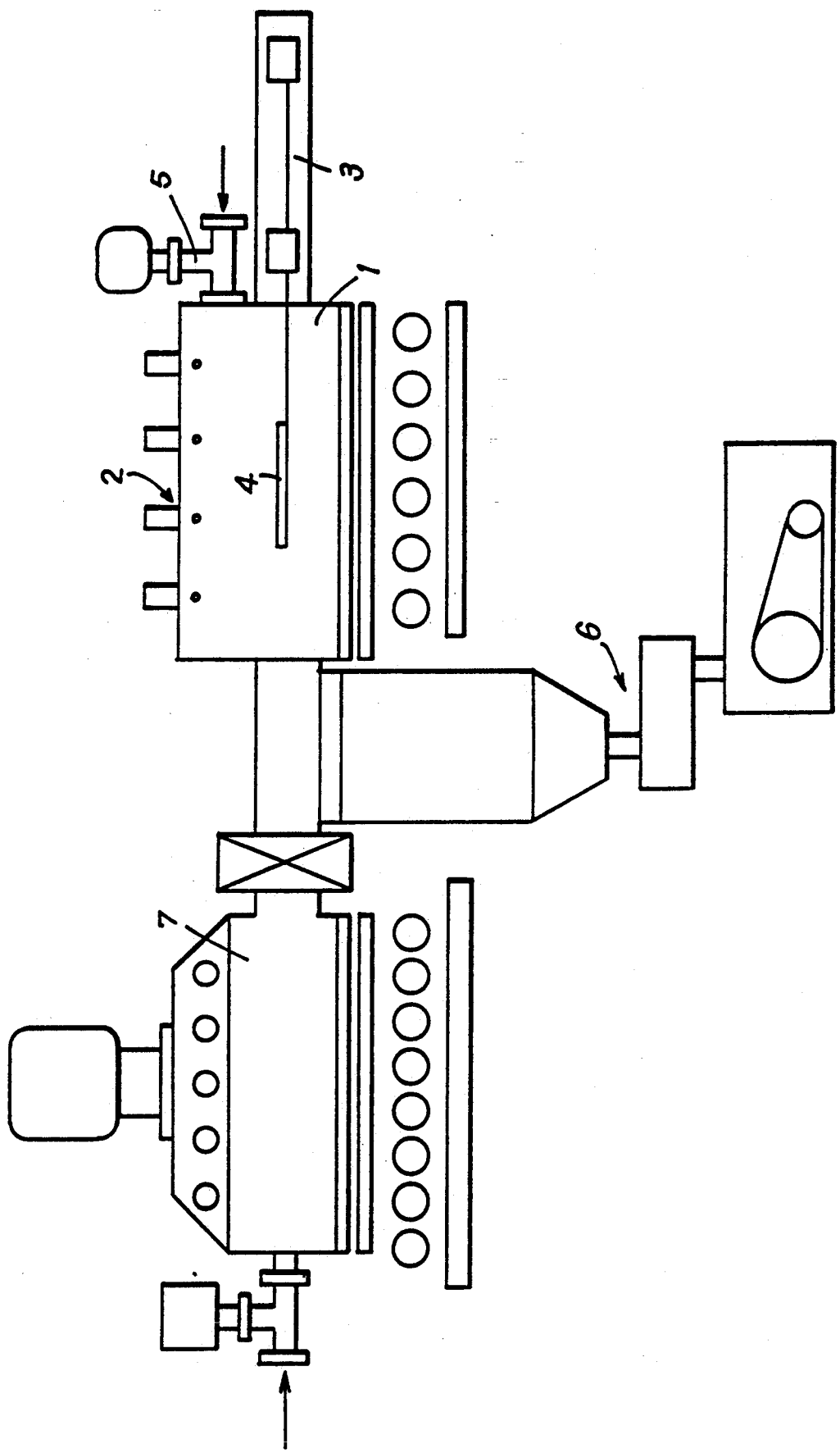

METHOD FOR CLEANING THE SURFACE OF A SUBSTRATE WITH PLASMA

FIELD OF THE INVENTION

The present invention relates to the general technical field of the methods for cleaning or etching the surface of a substrate, preferably a silicon-based substrate, notably by growth of layers or depositions.

BACKGROUND OF THE INVENTION

The treatment, such as epitaxy of a silicon-based substrate, requires that the substrate has a clean surface in order to obtain an epitaxy of good quality. It seems therefore necessary to remove the native oxide, the carbon and any other impurities present on the surface of the substrate.

In the aforesaid preferred application, namely epitaxy on silicon, the prior art has proposed the use, as method for cleaning the surface of a substrate, of thermal etchings conducted at relatively high temperatures, around 800° to 900° C., and resulting from the conversion of silicon oxide into volatile species.

These cleaning methods, which are performed at relatively high temperatures, are not suitable for the production of microelectronoic components of ULSI (Ultra Large Scale Integration) type. Indeed, it is impossible when using a very high heating power, to preserve the sharp doping profiles of the substrates. Also, the use of high temperatures is incompatible with the operation of new microelectronic structures, such as heterostructures or heteroepitaxies.

In an attempt to overcome these drawbacks, the prior art has proposed to use an ion bombardment in order to effect such cleanings at lower temperatures. To this effect, the document by B. ANTHONY et al., J. Vac. Sci. Technol., B7, page 621, 1989, has recommended the use of hydrogen plasmas to ensure said etching function. But it has been found that such a plasma does not make it possible to remove easily the native oxide present on the surface of the silicon. Moreover, a hydrogen plasma etches the silicon much quicker than silica and any roughness on the surface of the silica will be transferred and accentuated in the silicon.

Furthermore, the documents by T. J. DONAHUE et al., J. Appl. Phys. 57, page 2757, 1985 and by COMFORT et al., J. Appl. Phys. 62, page 3388, 1987, have also proposed the use of argon plasmas which are known to act according to the spraying mechanism. The use of argon plasmas implies using strong energy-producing ions which cause defects in the silicon, as well as an implantation of argon in the substrate. Consequently, argon plasmas are used at a sufficiently high temperature and are generally followed by annealing at relatively high temperature, around 800° C., to eliminate all the defects created by said technique.

Finally, the document by TRI-RUNG YEW et al., J. Appl. Phys. 68, page 4681, 1990 has recommended to subject the substrate to a plasma of argon mixed with hydrogen, in temperature conditions of about 700° C.

The analysis made of the prior art has therefore revealed that there is a need to find a method for low temperature cleaning of the surface of a substrate, to be implemented before another treatment such as epitaxy or deposition.

FIELD OF THE INVENTION

It is the object of the invention to meet the aforesaid requirement by proposing a new method for cleaning, at low temperature, with plasma, the surface of a substrate for removing all impurities from said surface, and allowing a subsequent coating in favorable conditions.

For said object to be attained, the method according to the invention, for cleaning by plasma the surface of a substrate before the application of a treatment, consists:

in a first cleaning step, in polarizing negatively the substrate and subjecting it to an argon plasma, and in a second cleaning step, in subjecting the pretreated substrate to a hydrogen plasma, in order to ensure an efficient cleaning of the surface of the substrate.

An advantageous feature of the method according to the invention is that, the first and second cleaning steps are performed without using any heating means.

Another advantageous feature is that the method consists in polarizing negatively the substrate, during the first cleaning step, within a voltage range of 20 to 100 volts.

BRIEF DESCRIPTION OF THE DRAWINGS

The invention will be more readily understood, on reading the following description, with reference to the accompanying drawing, showing non-restrictively, one embodiment of the invention.

The single figure is a diagrammatical view of a machine for implementing the cleaning method according to the invention.

DETAILED DESCRIPTION OF PREFERRED EMBODIMENT

The figure illustrates one embodiment of a machine adapted for the implementation of the method according to the invention for cleaning the surface of a substrate containing, preferably, silicon. Said machine, for example of the JIPELEC, FUV4 type comprises a tight enclosure 1, provided with means 2 adapted for producing a multipolar microwave plasma. Conventionally, it is possible, in order to obtain plasmas of good homogeneity, to create a multipolar magnetic confinement and to use a localized microwave source.

The enclosure 1 is also equipped with a device 3 for feeding a substrate 4, such as a silicon board, into the enclosure 1. Said enclosure 1 is also provided with a gas-introducing device 5 and with a gas-pumping device 6, for keeping the pressure of the gas to be ionized to the wanted value which can be for example of $10^{-1}$ to 10 Pa.

According to the invention, the cleaning method consists, in a first step, in supplying argon to the chamber and in igniting the plasma, in order to subject the substrate 4 to an argon plasma. During this last cleaning step, it has to be noted that the substrate is polarized negatively by any known and suitable means, such as for example, a continuous polarization of the substrate-holder.

The function of the argon plasma is to remove the native oxide, the carbon, as well as any impurities present on the surface of the substrate. This is ensured by the spraying mechanism which appears in such an argon plasma. The polarization and energy of the ions are selected for performing such function and can be adjusted in relation to the preparation of the surface, and in particular, of the thickness of silica on said surface.

Experience has shown that the substrate could be polarized negatively within a voltage range of 20 to 100 volts and that the energy of the ions is preferably between 20 and 100 electron-volts. Practical experiments have shown that with an ionic current of about $10^{15}$ ions/cm2 of energy ranging between 50 and 100 electron-volts, a treatment at room temperature, for a period of about 2 minutes, is sufficient to perform the above-described cleaning function. The treatment conducted in the aforesaid conditions corresponds to the abrasion of 50 Ångströms.

It should advantageously be noted that treatment with argon plasma can be performed without having to use means for heating the substrate. Such a cleaning is therefore performed at temperatures around room temperature, and even below.

According to the invention, said substrate, pretreated with argon plasma, is subjected to a hydrogen plasma in a second cleaning phase consecutive to the first. In the machine described hereinabove, it is recommended to substitute the argon in chamber 1 by hydrogen. Understandably, there may be a possibility of transferring the substrate 4, after the first treatment step, into a separate enclosure, identical to enclosure 1, and in which the hydrogen plasma is produced. The hydrogen plasma, which is relatively efficient for etching silicon, permits the elimination from the substrate of the silicon area affected by the treatment with argon plasma. Advantageously, said second step is also performed without using heating means.

Experiments have proved that the treatment, with hydrogen plasma, of the surface of a substrate for a period of 2 minutes at ambient temperature, leaves a perfectly clean surface. Such a treatment, with hydrogen plasma, corresponds to an etching of 100 Ångströms of monocrystalline silicon.

Preferably, the hydrogen plasma is of poor energy-producing nature, this preventing the formation of defects in the silicon. For example, it can be proposed to set the energy of the ions to around the electron-volt.

According to an advantageous feature of the method, the substrate can be polarized positively in said second cleaning step.

Combination of the two cleaning steps leads to an efficient and good quality cleaning of the substrate. Also, advantageously, the two cleaning steps are performed at low temperature. The method according to the invention, permitting the cleaning of a substrate at low temperatures, makes it possible to produce ULSI-type microelectronic components. In addition, the proposed method, which begins with a just slightly selective step, depends only relatively slightly on the prior treatments undergone by the substrate. Such a method can therefore be widely used with silicon-based substrates.

The substrate 4, thus cleaned and etched is particularly suitable for receiving epitaxic depositions inside a reactor 7. Such depositions can, for example, be performed at a temperature of about 800° C., which is a relatively low temperature for such a technique.

The cleaning method according to the invention also permits etching of the surface of a substrate at room temperature or below, without any of the drawbacks known to exist with the prior techniques, such as, on the one hand, a poor efficiency of the treatment towards oxide compared to silicon, which generates a transfer of the roughness into the silicon and, on the other hand, an implantation of argon which settles in the silicon network.

The invention is not in any way limited to the example described and illustrated hereinabove, and various modification can be brought thereto without departing from its scope.

We claim:

1. Method for cleaning, with plasma, the surface of a substrate before the application of a treatment, wherein said method consists:

in a first cleaning step, in polarizing negatively the substrate and in subjecting it to plasma, consisting of argon plasma and in a second cleaning step, in subjecting the pretreated substrate to a hydrogen plasma, in order to ensure an efficient cleaning of the surface of the substrate.

2. Method as claimed in claim 1, wherein said method consists in performing the first and second cleaning steps, without using heating means.

3. Method as claimed in claim 1, wherein said method consists, during the first cleaning step, in polarizing negatively the substrate within a voltage range of 20 to 100 volts.

4. Method as claimed in claim 1, wherein said method consists in subjecting the substrate to an argon plasma whose ion energy ranges between 20 and 100 electron-volts.

5. Method as claimed in claim 1, wherein said method consists in subjecting the substrate to a hydrogen plasma whose ion energy is set to around the electron-volt.

6. Method as claimed in claim 1, wherein said method consists, in the second cleaning step, in polarizing positively the substrate.

7. Method as claimed in claim 1, wherein said method consists in performing the first and second cleaning steps in two different chambers.

* * * * *